(12) United States Patent
Han

(10) Patent No.: US 10,081,859 B2
(45) Date of Patent: Sep. 25, 2018

(54) DEVICE FOR ADJUSTING FLATNESS OF PLATE

(71) Applicant: SAMSUNG DISPLAY CO., LTD., Yongin-si, Gyeonggi-Do (KR)

(72) Inventor: Jeong Won Han, Seongnam-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 321 days.

(21) Appl. No.: 14/926,243

(22) Filed: Oct. 29, 2015

(65) Prior Publication Data
US 2016/0290740 A1    Oct. 6, 2016

(30) Foreign Application Priority Data

Mar. 30, 2015 (KR) .................. 10-2015-0044359

(51) Int. Cl.
| F28D 11/06 | (2006.01) |
| B05C 11/00 | (2006.01) |
| C23C 14/04 | (2006.01) |

(52) U.S. Cl.
CPC ................. *C23C 14/042* (2013.01)

(58) Field of Classification Search
CPC .. C23C 14/042; F28F 2255/02; F28D 9/0087; Y10T 29/49863
USPC .............. 165/84; 313/402, 407; 118/44, 500
See application file for complete search history.

(56) References Cited

U.S. PATENT DOCUMENTS

| 3,482,343 | A | * | 12/1969 | Hamu | B41F 15/36 101/127.1 |
| 4,156,399 | A | * | 5/1979 | Fieux | B44D 7/00 118/500 |
| 4,537,244 | A | * | 8/1985 | Holden | H01J 37/20 118/50 |
| 5,932,957 | A | * | 8/1999 | Ragland, Jr. | H01J 9/142 313/402 |
| 7,537,798 | B2 | * | 5/2009 | Shigemura | H01L 51/0004 118/721 |
| 2012/0090176 | A1 | * | 4/2012 | Stancel | H02S 20/00 29/890.033 |
| 2013/0175005 | A1 | * | 7/2013 | Gowdaru | H01L 21/67109 165/84 |

FOREIGN PATENT DOCUMENTS

| KR | 10-2009-0104149 A | 10/2009 |
| KR | 10-2010-0069788 A | 6/2010 |
| KR | 20100069788 A * | 6/2010 |
| KR | 10-1307153 B1 | 9/2013 |
| KR | 10-1310336 B1 | 9/2013 |
| KR | 10-2014-0103464 A | 8/2014 |

* cited by examiner

*Primary Examiner* — Jason Thompson
(74) *Attorney, Agent, or Firm* — Lee & Morse, P.C.

(57) ABSTRACT

A plate flatness adjusting device includes at least one tendon, an accommodation portion, and a tensile strength adjuster. The at least one tendon penetrates a through-hole of a plate and has lateral ends protruding outside of the plate. The accommodation portion accommodates the lateral ends of the at least one tendon. The tensile strength adjuster is coupled to the accommodation portion to adjust a tensile strength of the at least one tendon. The adjusted tensile strength adjusts a degree of flatness of the plate.

8 Claims, 9 Drawing Sheets

Displacement Mag (WCS)
(mm)
Max Disp  7.0304E-01
Loadset:LoadSet1 :  PRT0001

Displacement Mag (WCS)
(mm)
Max Disp 5.1757E-01
Loadset:LoadSet1 : PRT0001

0.51757
0.46581
0.41405
0.36230
0.31054
0.25878
0.20703
0.15527
0.10351
0.05176
0.00000

DEVICE FOR ADJUSTING FLATNESS OF PLATE

CROSS-REFERENCE TO RELATED APPLICATION

Korean Patent Application No. 10-2015-0044359, filed on Mar. 30, 2015, and entitled, "Device for Adjusting Flatness of Plate," is incorporated by reference herein in its entirety.

BACKGROUND

1. Field

One or more embodiments described herein relate to a device for adjusting the flatness of a plate.

2. Description of the Related Art

Electronic products are manufactured using a variety of processes. For example, a deposition process may be performed to deposit an organic thin film and a mask, and a substrate may be attached to the mask in an air-tight environment, in order to allow an organic material pattern to be uniformly deposited on the substrate. During this process, the mask and substrate are exposed to relatively high-temperature organic material steam for long periods of time. The heat may deform the mask and substrate and cause them to separate from each other.

If the deposition process is performed while the mask and the substrate are separated from each other, the thin film deposition pattern may be formed with an irregular shape or may be formed larger than a slit in the mask. This may adversely affect the performance of the finished product.

In an attempt to prevent this separation, a cooling plate may be provided above the substrate to dissipate the heat. Also, the substrate may be pressed toward the mask to reduce thermal deformation of the mask and the substrate. However, cooling plate may not be flat, e.g., the center portion of the cooling plate may sag to a greater extent than edge portions due to gravity. This may translate into non-uniform or irregular heat dissipation, which may adversely affect product performance.

SUMMARY

In accordance with one or more embodiments, a plate flatness adjusting device includes at least one tendon penetrating a through-hole of a plate and having lateral ends protruding outside of the plate; accommodation portion to accommodate the lateral ends of the at least one tendon; and a tensile strength adjuster coupled to the accommodation portion to adjust a tensile strength of the at least one tendon, the adjusted tensile strength to adjust a degree of flatness of the plate.

The at least one tendon may include two or more first tendons penetrating the plate in a first direction; and two or more second tendons penetrating the plate in a second direction. The two or more first tendons may be higher than the two or more second tendons. The at least one tendon may include two or more third tendons penetrating the plate in a third direction; and two or more fourth tendons penetrating the plate in a fourth direction. The first tendons, the second tendons, the third tendons, and the fourth tendons may be spaced from one another.

The accommodation portion may include a frame including the plate; and a socket in the frame and having a first side coupled to the tendon and a second side coupled to the tensile strength adjuster. The frame may surround a side surface of the plate. The frame may have substantially a quadrangle shape. The plate may be a cooling plate.

In accordance with one or more other embodiments, an apparatus includes a frame; a number of first tendons coupled to the frame and passing through a cooling plate of a thin film deposition device; and an adjuster to apply a variable force to the number of first tendons, wherein the number of first tendons extend in a first direction and wherein the variable force is to apply a first stress to the cooling plate to adjust a degree of flatness of the cooling plate. The adjuster may apply a variable tensile force. The number of first tendons may be greater than one.

The apparatus may include a number of second tendons coupled to the frame, wherein the number of second tendons extends in a second direction crossing the first direction and wherein the adjuster is to apply a variable force to the number of second tendons, the variable force applied to the number of second tendons to apply second stress to the cooling plate to adjust the degree of flatness of the cooling plate. The second stress may be different from the first stress. The adjuster may independently adjust the variable forces to be applied to the numbers of first and second tendons. The number of first tendons maybe offset from the number of second tendons in a third direction different from the first and second directions.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
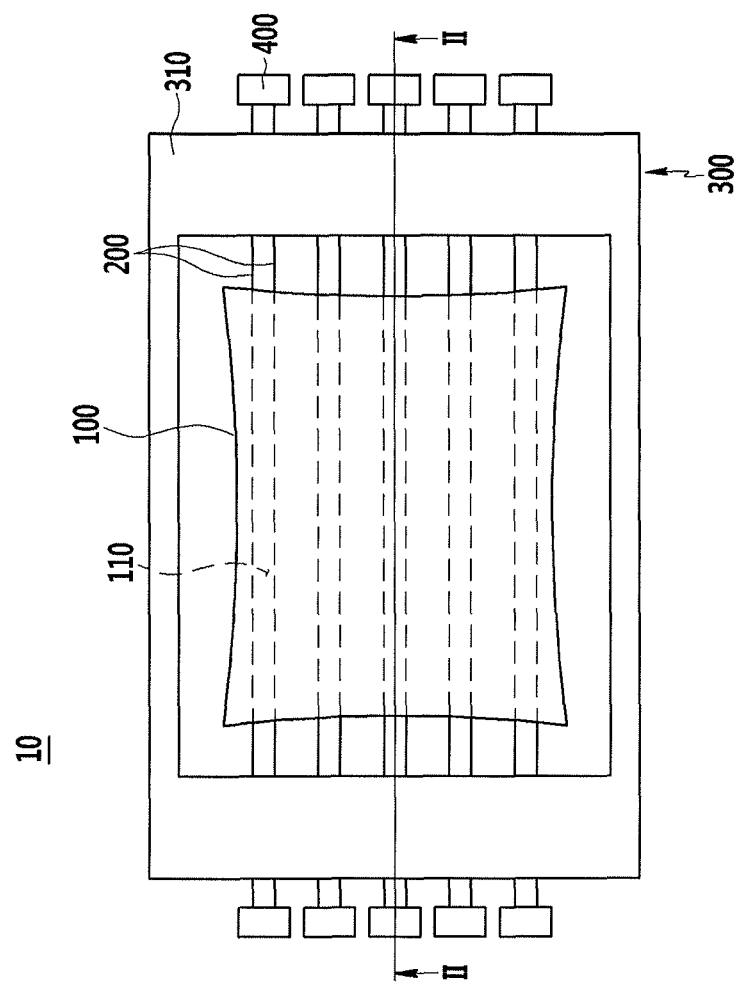
FIG. 1 illustrates an embodiment of a plate flatness adjusting device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Also, the word "on" means positioning on or below the object portion, but does not necessarily mean positioning on the upper side of the object portion based on a gravitational direction.

Also, the term "plate" refers to a flat member formed in various shapes using various materials, and a cooling plate that is provided in a thin film deposition device to cool a substrate to prevent deformation of the substrate during a deposition process of a thin film, such as a semiconductor, a display, and the like, will be described as an example of the plate, but the scope of the described technology is not limited thereto.

Figure 2:
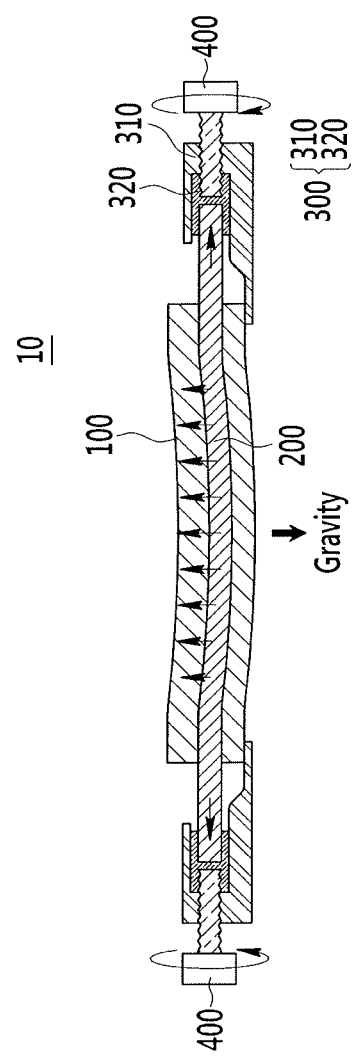
FIG. 2 illustrates another view of the plate flatness adjusting device.

FIG. 1 is a top plan view of an embodiment of a plate flatness adjusting device 10, and FIG. 2 is a cross-sectional view of the plate flatness adjusting device 10.

Referring to FIGS. 1 and 2, the plate flatness adjusting device 10 includes a tendon 200, an accommodation portion 300, and a tensile strength adjusting member 400. The plate flatness adjusting device 10 is mounted on a cooling plate 100 in a thin film deposition device. Then, lateral ends of the tendon 200 are strained and pulled through the tensile strength adjusting member 400 such that stress in the arrow direction is induced toward the outside from the inside of the curved plate 100, thereby preventing sagging of the cooling plate due to gravity. Further, flatness of the plate 100 may be compensated by applying induced stress to the deformed curved plate 100.

First, the cooling plate 100 cools a substrate to prevent deformation of the substrate during a thin film deposition process of a semiconductor, a display, and the like. The cooling plate 100 may be, for example, a plate made of a metal that is resistant to deformation by having an expansion coefficient. Examples include a titanium alloy, a stainless alloy, or an invar alloy. The plate 100 has a predetermined thickness in order to reduce or minimize deformation due to heat.

The plate 100 is arranged parallel to and contacts the upper portion of the substrate during the thin film deposition process. The plate 100 may be provided in the thin film deposition device, for example, in a manner that the thickness direction of the plate 100 equals the direction of gravity. The plate 100 maintains a flat state at an initial installation state. However, the plate 100 may deform in a curved or parabola shape due to sagging over time at the center thereof due to gravity. For example, as shown in FIG. 2, the plate 100 may be a parabola-shaped curved plate having a center portion that sags based on the direction of gravity.

As shown in FIG. 1, through-holes 110 are formed to penetrate the plate 100. Two or more through-holes 110 may be provided parallel and at a distance from each other. The spacing or gaps between neighboring through-holes 110 may be equal or different to each other. A cross-section of each through-hole 110 may have, for example, a U-shape corresponding to the plate 100 that is deformed in a parabola shape as shown in FIG. 2.

The tendon 200 penetrates the through-hole 110 as shown in FIG. 1, such that lateral ends of the tendon 200 protrude outside the plate 100. In one embodiment, two or more tendons 200 may be provided, with each tendon 200 provided for a respective one of the through-holes 110. The two or more tendons 200 extend in a first direction D1, e.g., an extension direction of each through-hole 110.

The tendon 200 may be a linear member having a smaller cross-section than a cross-section of the through-hole 110. Unlike FIGS. 1 and 2, the tendon 200 may be made of a flexible material (e.g., wire or rope) to penetrate the U-shaped through-hole 110 when the plate 100 is deformed in the shape of a parabola. The cross-section of each tendon 200 may have a shape that corresponds to the shape of the through-hole 110. In another embodiment, the cross-section of each tendon 200 may have a shape different from the shape of the through-hole 100. Examples include a circular, oval, polygonal, or another shape cross-section.

The tendon 200 may be made of a material having a comparatively small electric modulus, so as to not be easily deformed even if tension is applied to its lateral ends. Thus, when the lateral ends of the tendon 200 are pulled, the tendon 200 is strained. As shown in FIG. 2, stress in the arrow direction may be smoothly induced toward the upper external side of the plate 100 from the inside. Thus, gravity applied to the plate 100 is offset by generating an induced stress in the arrow direction of FIG. 2 through tension of the tendon 200. As a result, sagging of the plate 100 due to gravity may be reduced or minimized when the plate 100 is used in or by the thin film deposition device. Further, even where the plate 100 has already sagged due to gravity, the degree of flatness may be adjusted to flatten the upper portion of the plate 100. Each tendon 200 may be considered a tension member.

The accommodation portion 300 may accommodate externally protruding lateral ends of the tendon 200 by fixing the same. The accommodation portion 300 includes an accommodation frame 310 and an accommodation socket 320.

The accommodation frame 310 may be formed, for example, in the shape of a quadrangle as shown in FIG. 1. An opening that is greater than a cross-section of the plate 100 is formed in the center of the accommodation frame 310 to accommodate the plate 100 from its upper portion. In addition, as shown in FIG. 2, an upper side of the opening is formed to be narrower than a lower side of the opening, in order to support the lower side of the accommodated plate 100. In one embodiment, a cross-section of the lower side of the opening may be smaller than the cross-section of the plate 100. Thus, when the plate 100 is accommodated, the accommodation frame 310 surrounds the side surface of the plate 100.

The accommodation socket 320 may be provided in the accommodation frame 310. Two accommodation sockets 320 are arranged to face at respective lateral sides of the accommodated plate 100. A fixing groove is formed in each accommodation socket in a direction that faces the accommodated plate 100. A screw groove is formed in the opposite surface of the fixing groove. As shown in FIG. 2, lateral ends of the tendon 200 are respectively accommodated to the fixing grooves of the pair of accommodation sockets 320 and then fixed thereto.

The tensile strength adjusting member 400 may be, for example, a pair of compensation bolts penetrating lateral side surfaces of the accommodation frame 310, as shown in FIG. 2. The bolts may respectively combine with the screw grooves of the pair of accommodation sockets 320. The tensile strength adjusting members 400 apply tensile strength to lateral sides of the tendon 200 when tightened in the arrow direction, as shown in FIG. 2. Thus, the tensile strength adjusting members 400 adjust the tensile strength applied to the tendon 200 through rotation.

In the present embodiment, tensile strength is applied to the tendon 200 through the tensile strength adjusting members 400 so that stress compensating for gravity is induced in the plate 20. Accordingly, the degree of flatness of the cooling plate may be adjusted through a relatively simple structure, without using a complex flatness measurement and compensation device.

Figure 3:
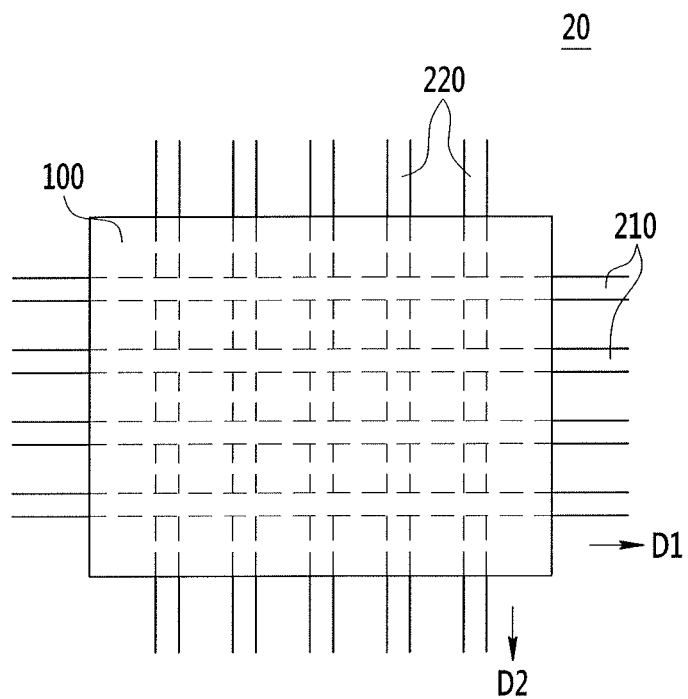
FIG. 3 illustrates another plate flatness adjusting device.

FIG. 3 is a top plan view illustrating another embodiment of a plate flatness adjusting device 20 which includes a first tension member 210 extending in a first direction D1 and a second tension member 220 extending in a second direction D2. This embodiment is different from the previous embodiment in that the tension portions penetrating plate 100 extend in two directions. D1 and D2. For example, the first direction D1 may be a horizontal direction of the plate 100 and the second direction D2 may be a vertical direction of the plate 100. The tension members may also be considered to be tendons.

The first tension members 210 and the second tension members 220 cross each other when viewed from the top. However, the first direction D1 and the second direction D2 may be provided at offset locations, such that the first tension member 210 and the second tension member 220 do not contact one another. For example, the first tension member 210 may extend and penetrate the plate 100 at a location higher than the second tension member 220. Thus, the first tension member 210 may be pulled to induce stress to an upper portion of the plate 100 and the second tension member 200 may be pulled to induce stress to a lower portion of the plate 100. The stress applied by the tension members or tendons may be independently adjusted and, for example, may be the same or different from one another. This applies in all of the embodiments described herein and irrespective of the direction in which the tension members or tendons extend.

The first tension member 210 and the second tension member 220 spaced from one another and are respectively disposed at different directions, D1 and D2, in the height direction of the plate 100. Thus, flatness of the plate 100 may be thicker than the plate 100 of previous embodiment.

Figure 4:
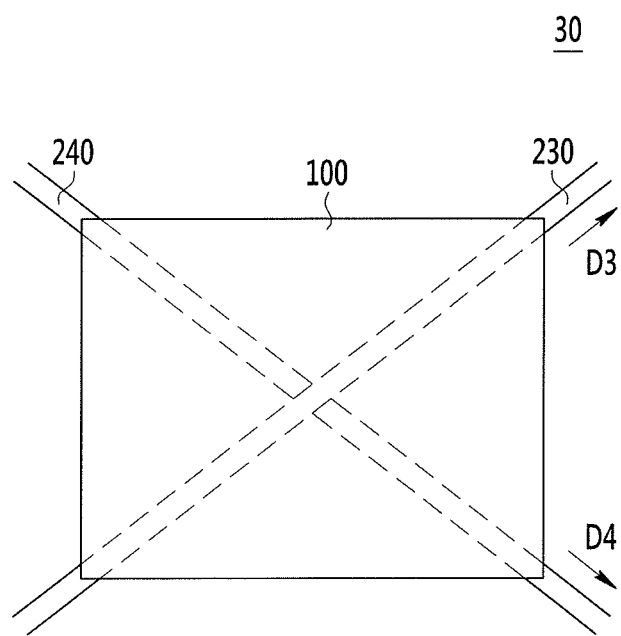
FIG. 4 illustrates another plate flatness adjusting device.

FIG. 4 illustrates another embodiment of a plate flatness adjusting device 30 which includes a third tension member 230 penetrating a plate 100 and extending in a third direction D3 and a fourth tension member 240 penetrating the plate 100 and extending in a fourth direction D4. This embodiment is different from the previous embodiment in that the tension members that extend in the third and fourth directions D3 and D4 different from the first and second directions D1 and D2. The third tension member 230 and the fourth tension member 240 are offset and thus do not contact each other.

In the present embodiment, when the plate 100 is flat, the third direction D3 corresponds to an upper right diagonal direction and the fourth direction D4 corresponds to a lower right diagonal direction. That is, unlike the previous embodiment, the third tension member 230 and the fourth tension member 240 may be separately disposed in directions that are different from the first and second directions D1 and D2. In particular, in the third exemplary embodiment, flatness of a plate that is significantly deformed in a diagonal direction may be easily compensated.

Figure 5:
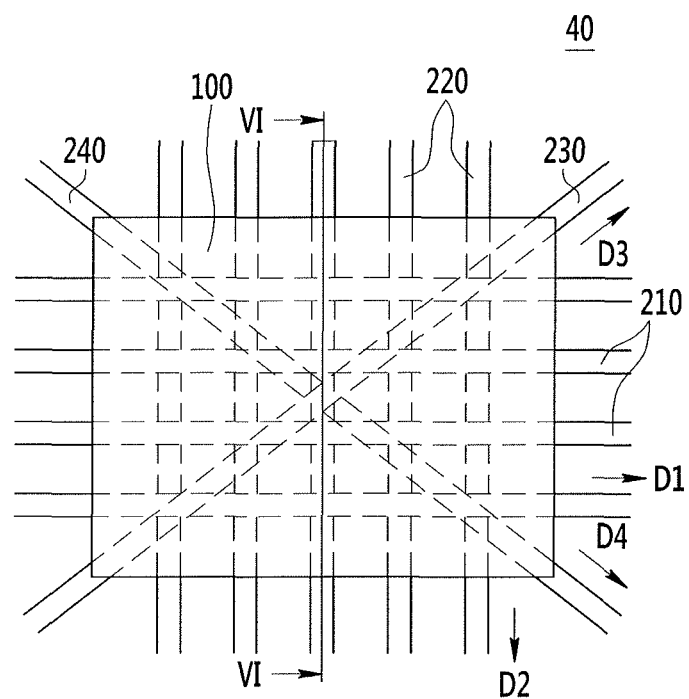
FIG. 5 illustrates another plate flatness adjusting device.
Figure 6:
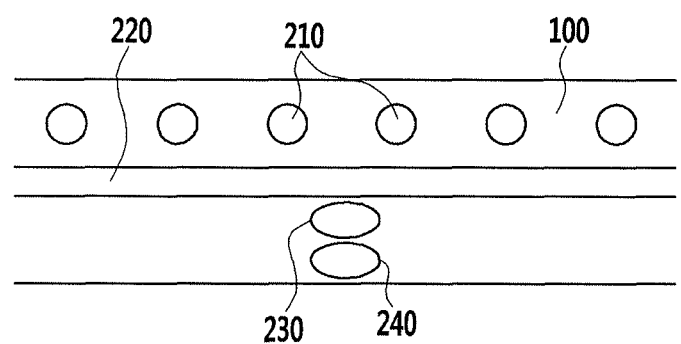
FIG. 6 illustrates a view along section line VI-VI in FIG. 5.

FIGS. 5 and 6 illustrate another embodiment of a plate flatness adjusting device 40 which include first, second, third, and fourth tension members 210, 220, 230, and 240 that respectively penetrate a plate 100. The first, second, third, and fourth tension members 210, 220, 230, and 240 are offset from and do not contact one another. For example, as shown in FIG. 6, the first, second, third, and fourth tension members 210, 220, 230, and 240 are sequentially distanced from each other from the uppermost portion of the bottom in the plate 100. Since the first, second, third, and fourth tension members 210, 220, 230, and 240 respectively penetrate the plate 100, the flatness of a plate thicker than the plates of the previous embodiments may be more precisely compensated.

Examples of how the sagging of a plate due to gravity is improved in accordance with one or more of the aforementioned embodiments of the plate flatness adjusting device will now be described in the context of a thin film deposition device.

Figure 7:
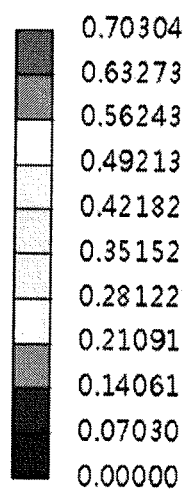
FIG. 7 illustrates an example of plate deformation with may occur when a plate flatness adjusting device of any of the aforementioned embodiments is not used.
Figure 7:
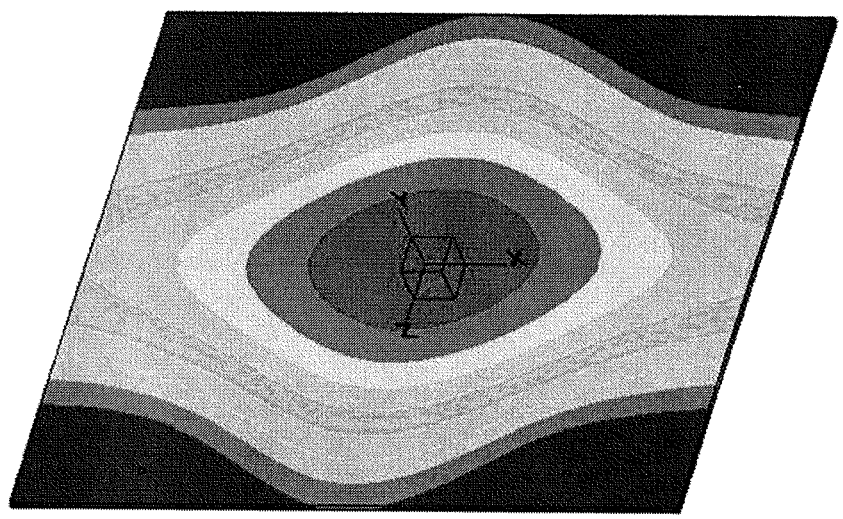
Figure 8:
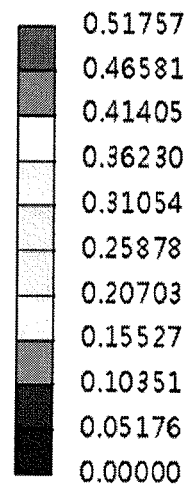
FIG. 8 illustrates an example of deformation that may occur when one or more of the aforementioned embodiments of the plate flatness adjusting device are used.
Figure 8:
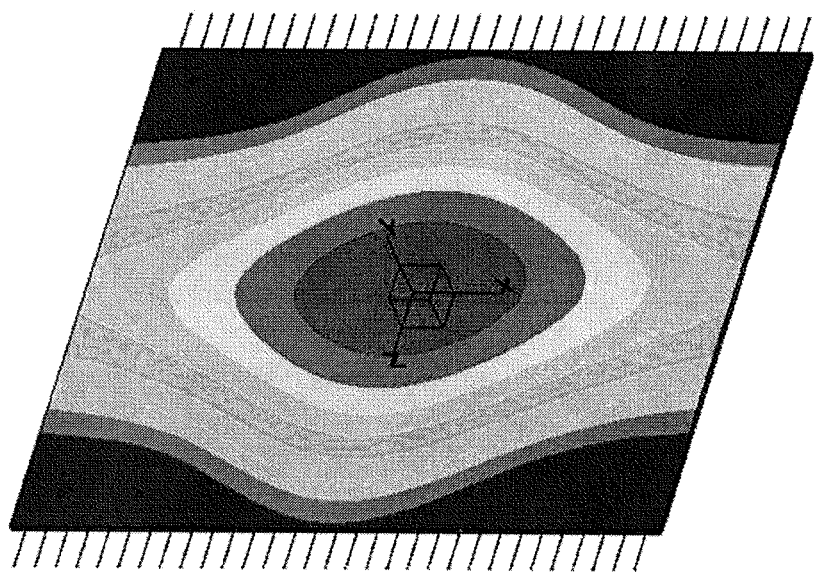
Figure 9:
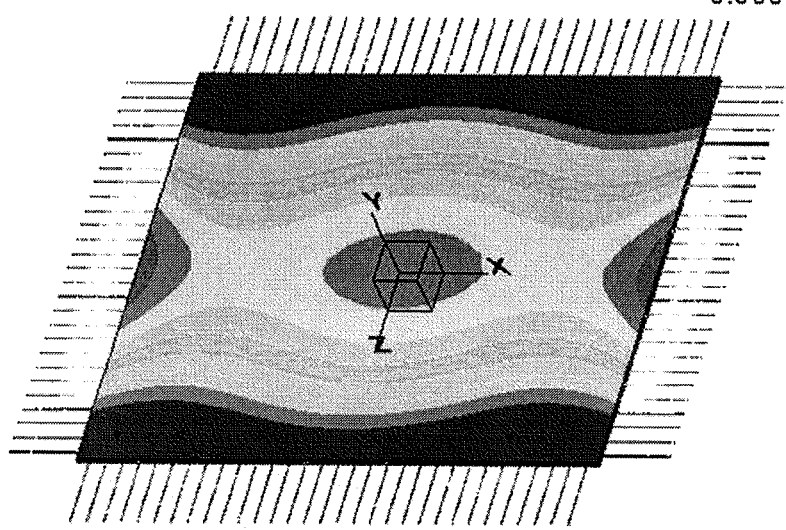
FIG. 9 illustrates another example of deformation that may occur when one or more of the aforementioned embodiments of the plate flatness adjusting device are used.

FIG. 7 illustrates an example of simulation results indicating the amount of deformation of a plate that occurs when none of the embodiments of the plate flatness adjusting device is used. FIG. 8 illustrates an example of simulation results indicating the amount of plate deformation that occurred when the plate flatness adjusting device of FIG. 1 was used. FIG. 9 illustrates an example of simulation results indicating the amount of plate deformation that occurred when the plate flatness adjusting device of FIG. 3 was used.

Referring to FIGS. 7 to 9, a flat metal plate made of a titanium material and that was 754 mm long, 653 mm wide, and 8 mm thick were used in each case. In the plate flatness adjusting devices used for FIGS. 8 and 9, a tensile strength of 1000N was equally applied to each tendon through tensile strength adjusting devices.

In FIG. 7, where a plate flatness adjusting device of the present embodiments was not installed a thin film deposition device, the simulation results showed significant deformation, e.g., a deformation amount of 0.703 mm was measured around the center portion and the von-mises stress was measured to be 107.25 kPa.

In FIG. 8, where the plate flatness adjusting device of FIG. 1 was installed in the thin film deposition device, the simulation results showed that the maximum deformation amount was 0.518 mm and the von-mises stress was 145.68 kPa. Thus, the deformation amount was reduced.

In FIG. 9, where the plate flatness adjusting device of FIG. 3 was installed in the thin film deposition device, the simulation results showed that deformation was significantly reduced, e.g., the maximum deformation amount was 0.085 mm and the von-mises stress was 1124.4 kPa.

Thus, when a plate flatness adjusting device according to the aforementioned embodiment is used, the structural strength and sagging of the plate may be improved compared to the cause of FIG. 7. Also, the embodiment where the tendons are provided two directions was more effective than the embodiment where the tendons are provided in only one direction in terms of improving structural strength and the sagging.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A plate flatness adjusting device, comprising:
at least one tendon penetrating a through-hole of a plate and having lateral ends protruding outside of the plate;
an accommodation portion including a frame and the plate;
the frame of the accommodation portion accommodating the lateral ends of the at least one tendon; and
at least one tensile strength adjuster coupled to the frame of the accommodation portion to adjust a tensile strength of the at least one tendon, the adjusted tensile strength to adjust a degree of flatness of the plate, and
a socket in the frame and having a first side coupled to the tendon and a second side coupled to the tensile strength adjuster.

2. The device as claimed in claim 1, wherein the at least one tendon includes:
two or more first tendons penetrating the plate in a first direction; and
two or more second tendons penetrating the plate in a second direction,
wherein the at least one tensile strength adjuster comprises a plurality of tensile strength adjusters, and the tensile strength adjusters are to apply forces to adjust the tensile strengths of respective ones of the two or more first tendons and the two or more second tendons.

3. The device as claimed in claim 2, wherein the two or more first tendons are above the two or more second tendons.

4. The device as claimed in claim 2, wherein the at least one tendon further includes:
two or more third tendons penetrating the plate in a third direction; and
two or more fourth tendons penetrating the plate in a fourth direction,
wherein the at least one tensile strength adjuster comprises additional tensile strength adjusters, and the additional tensile strength adjusters are to apply forces to adjust the tensile strengths of respective ones of the two or more third tendons and the two or more fourth tendons.

5. The device as claimed in claim 4, wherein the first tendons, the second tendons, the third tendons, and the fourth tendons are spaced from one another.

6. The device as claimed in claim 1, wherein the frame surrounds a side surface of the plate.

7. The device as claimed in claim 6, wherein the frame has substantially a quadrangle shape.

8. The device as claimed in claim 1, wherein the plate is a cooling plate.

* * * * *